United States Patent
Kimura et al.

(10) Patent No.: US 10,566,567 B2
(45) Date of Patent: Feb. 18, 2020

(54) DISPLAY DEVICE

(71) Applicant: Japan Display Inc., Tokyo (JP)

(72) Inventors: Yasukazu Kimura, Tokyo (JP);
Shigeru Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 147 days.

(21) Appl. No.: 15/848,096

(22) Filed: Dec. 20, 2017

(65) Prior Publication Data

US 2018/0198084 A1 Jul. 12, 2018

(30) Foreign Application Priority Data

Jan. 11, 2017 (JP) .................................. 2017-002282

(51) Int. Cl.
*H01L 51/52* (2006.01)
*H01L 27/32* (2006.01)
*G09G 3/30* (2006.01)

(52) U.S. Cl.
CPC .......... *H01L 51/5203* (2013.01); *G09G 3/30* (2013.01); *H01L 27/3209* (2013.01); *H01L 27/3248* (2013.01); *H01L 27/3258* (2013.01); *H01L 27/3276* (2013.01); *G09G 2310/0264* (2013.01); *H01L 27/3265* (2013.01); *H01L 51/5237* (2013.01); *H01L 2251/303* (2013.01)

(58) Field of Classification Search
None
See application file for complete search history.

(56) References Cited

U.S. PATENT DOCUMENTS

| | | | | |
|---|---|---|---|---|
| 2007/0007515 A1* | 1/2007 | Suh | ...................... | H01L 27/3246 257/40 |
| 2007/0164275 A1* | 7/2007 | Ishiguro | .............. | H01L 27/3258 257/40 |
| 2008/0138624 A1* | 6/2008 | Lewis | ...................... | C23C 18/31 428/412 |
| 2009/0009068 A1 | 1/2009 | Fujimura et al. | | |
| 2012/0119235 A1* | 5/2012 | Nishiyama | .......... | H01L 27/3279 257/88 |
| 2016/0093645 A1* | 3/2016 | Lee | ...................... | H01L 51/5246 257/43 |

FOREIGN PATENT DOCUMENTS

| | | |
|---|---|---|
| JP | 2009-016231 A | 1/2009 |
| JP | 2012-022787 A | 2/2012 |

* cited by examiner

*Primary Examiner* — Dorothy Harris
(74) *Attorney, Agent, or Firm* — Michael Best & Friedrich LLP

(57) ABSTRACT

A display device includes a thin film transistor; a first organic insulating film covering the thin film transistor and containing a resin material; an inorganic insulating film on the first organic insulating film; a pixel electrode electrically connected with the thin film transistor; a second organic insulating film covering an end of the pixel electrode and exposing a top surface of the pixel electrode; and an organic layer provided on the top surface of the pixel electrode and including a light emitting layer. As seen in a plan view, the inorganic insulating film has an opening, overlapping the second organic insulating film, at a position not overlapping an opening provided in the first organic insulating film. The first and second organic insulating films face each other in the opening in the inorganic insulating film, with an oxide conductive film being between the first and second organic insulating films.

10 Claims, 16 Drawing Sheets

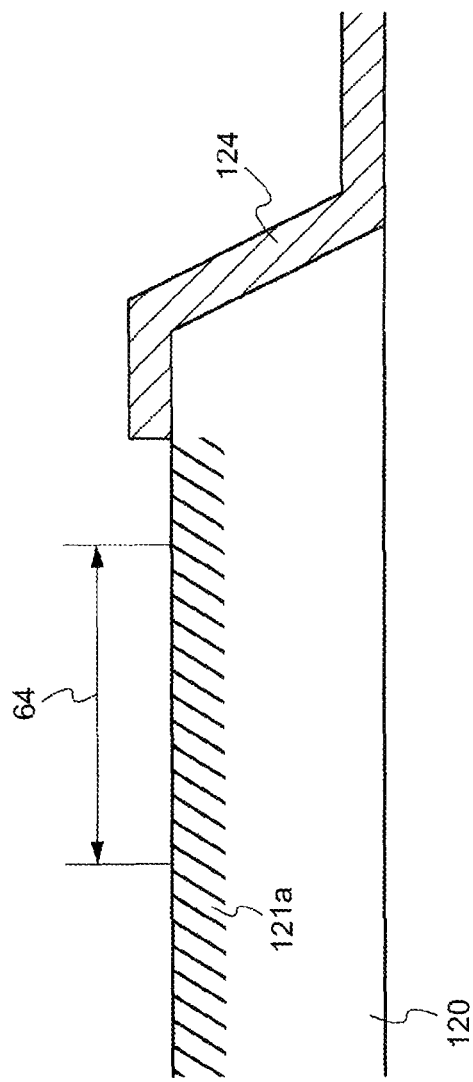

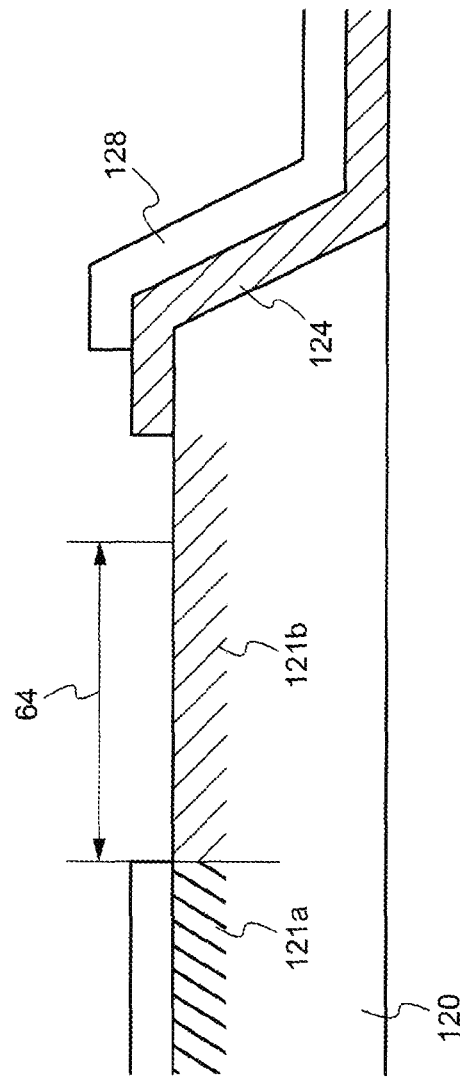

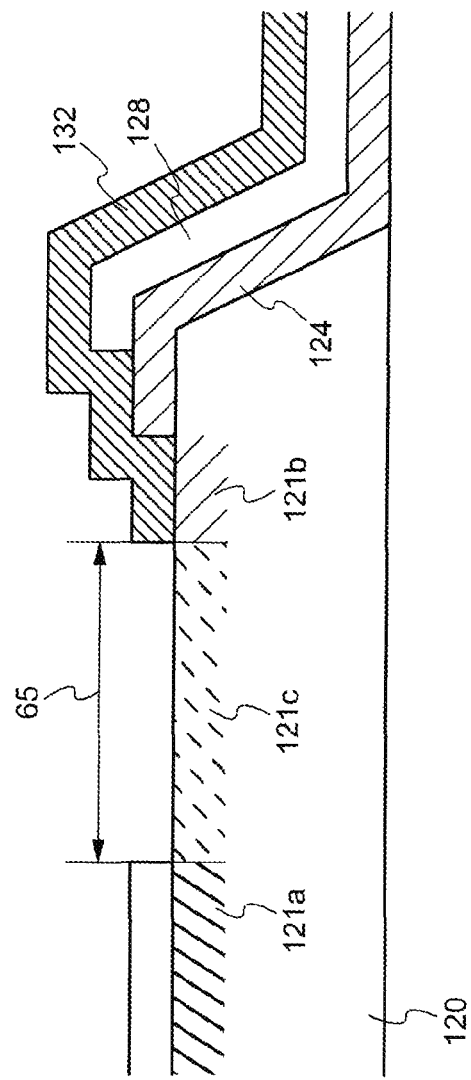

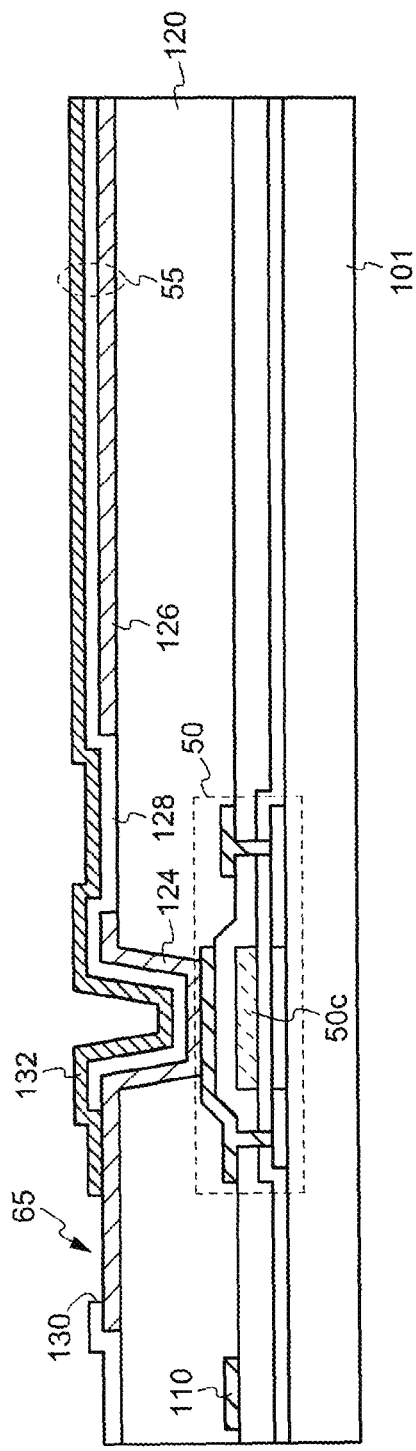

DISPLAY DEVICE

CROSS REFERENCE TO RELATED APPLICATIONS

This application is based on and claims the benefit of priority from the prior Japanese Patent Application No. 2017-002282, filed on Jan. 11, 2017, the entire contents of which are incorporated herein by reference.

FIELD

The present invention relates to a display device including a plurality of pixels, and specifically, to a display device including a light emitting element in each of the pixels.

BACKGROUND

Conventionally, as a display device usable for a display of a mobile terminal, a TV or the like, an organic EL (electroluminescence) display device including an organic EL element is known. An organic EL display device has advantages of emitting bright light, having superb viewing angle characteristics, and the like, and thus rapid development thereof is desired to provide a display device replacing a liquid crystal display device.

Usually, an organic EL display device includes a flattening film covering a thin film transistor and a light emitting element provided on the flattening film. For example, Japanese Laid-Open Patent Publication No. 2009-016231 and Japanese Laid-Open Patent Publication No. 2012-22787 discloses an organic EL display device including a pixel electrode provided on a flattening film containing an organic material, an inorganic insulating film exposing a part of a top surface of the pixel electrode, and an organic layer provided on the exposed part of the pixel electrode.

SUMMARY

A display device in an embodiment according to the present invention includes a thin film transistor; a first organic insulating film covering the thin film transistor, the first organic insulating film containing a resin material; an inorganic insulating film provided on the first organic insulating film; a pixel electrode electrically connected with the thin film transistor; a second organic insulating film covering an end of the pixel electrode and exposing a top surface of the pixel electrode, the second organic insulating film containing a resin material; and an organic layer provided on the top surface of the pixel electrode, the organic layer including a light emitting layer. As seen in a plan view, the inorganic insulating film has an opening, overlapping the second organic insulating film, provided therein, the opening being located at a position not overlapping an opening provided in the first organic insulating film; and the first organic insulating film and the second organic insulating film face each other in the opening provided in the inorganic insulating film, with an oxide conductive film being located between the first organic insulating film and the second organic insulating film.

A display device in an embodiment according to the present invention includes a thin film transistor; a first organic insulating film covering the thin film transistor, the first organic insulating film containing a resin material; an inorganic insulating film provided on the first organic insulating film; a pixel electrode electrically connected with the thin film transistor; a second organic insulating film covering an end of the pixel electrode and exposing a top surface of the pixel electrode, the second organic insulating film containing a resin material; and an organic layer provided on the top surface of the pixel electrode, the organic layer including a light emitting layer. As seen in a plan view, the inorganic insulating film has an opening, overlapping the second organic insulating film, provided therein, the opening being located at a position not overlapping an opening provided in the first organic insulating film; and the first organic insulating film and the second organic insulating film face each other in the opening provided in the inorganic insulating film, with the pixel electrode being located between the first organic insulating film and the second organic insulating film.

A display device in an embodiment according to the present invention includes a thin film transistor; a first organic insulating film covering the thin film transistor, the first organic insulating film containing a resin material; an inorganic insulating film provided on the first organic insulating film; and an oxide conductive film electrically connected with the thin film transistor via an opening provided in the first organic insulating film. As seen in a plan view, the inorganic insulating film has an opening, overlapping the oxide conductive film, provided therein, the opening being located at a position not overlapping the opening provided in the first organic insulating film.

BRIEF EXPLANATION OF DRAWINGS

FIG. 4A shows an example in which an oxide conductive film is not provided in an opening in an inorganic insulating film as opposed to embodiment 1;

FIG. 4B shows the example in which the oxide conductive film is not provided in the opening in the inorganic insulating film as opposed to embodiment 1;

FIG. 4C shows the example in which the oxide conductive film is not provided in the opening in the inorganic insulating film as opposed to embodiment 1;

FIG. 5E is a cross-sectional view showing the example of step in the method for producing the organic EL display device in embodiment 1;

DESCRIPTION OF EMBODIMENTS

Figure 1:
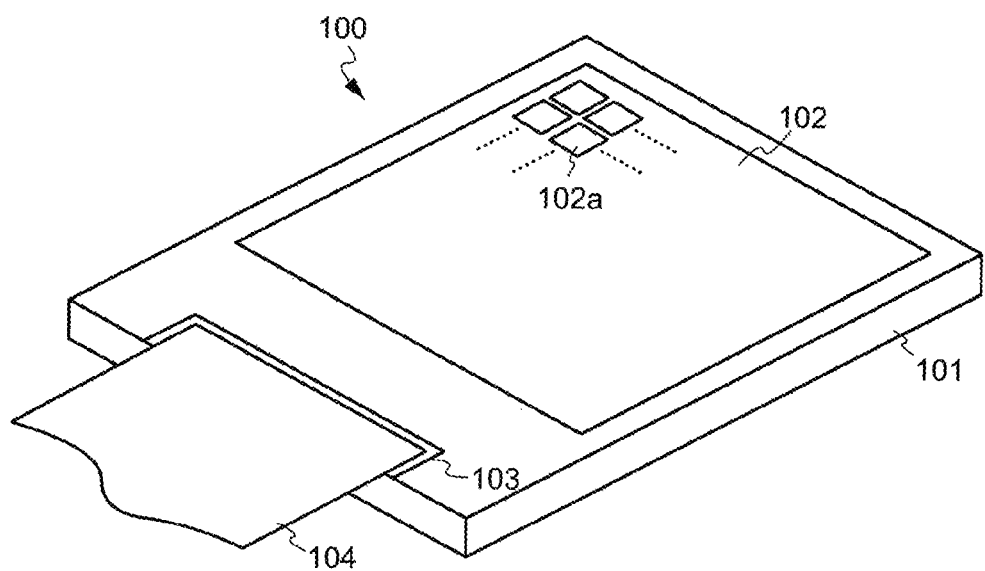
FIG. 1 is a perspective view schematically showing a structure of an organic EL display device in embodiment 1.

A flattening film containing an organic material contains moisture incorporated during the formation of the flattening film, or moisture absorbed in a washing step after the formation of the flattening film. When the flattening film is subjected to a heating process in this state, the moisture contained in the flattening film is evaporated. In the organic EL display device described in each of Japanese Laid-Open Patent Publication No. 2009-016231 and Japanese Laid-Open Patent Publication No. 2012-22787, the flattening film is covered with an inorganic insulating film or the like having a high airtightness, and therefore, the evaporated moisture is confined in the flattening film.

When the inorganic insulating film or a pixel electrode does not withstand the pressure received from the evaporated moisture, the inorganic insulating film or the pixel electrode may be peeled off from the flattening film. In this case, inconveniences may occur such that the pixel electrode is partially missed and thus a display failure is caused, or that an organic layer is deteriorated by the moisture discharged from the part where the inorganic insulating film or the pixel electrode is peeled off.

An object of the present invention is to reduce the influence of the moisture contained in an organic insulating film containing a resin material.

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component is "on" other component encompasses a case where such a component is in contact with the other component and also a case where such a component is above or below the other component, namely, a case where still another component is provided between such a component and the other component, unless otherwise specified.

In this specification and the claims, the terms "up", "down", "above", "below" and the like represent a positional relationship with respect to a face of a substrate on which light emitting elements are provided (hereinafter, this face will be referred to simply as a "surface"). For example, in this specification, a direction away from the surface of the substrate is defined as "upward", and a direction toward the surface of the substrate is defined as "downward".

Embodiment 1

<Structure of the Organic EL Display Device>

FIG. 1 is a perspective view schematically showing a structure of an organic EL display device 100 in embodiment 1. The organic EL (electroluminescence) display device 100 in this embodiment includes a substrate 101, and also includes a display portion 102 including a plurality of pixels 102a, a terminal portion 103 supplying an external signal to the display portion 102, and a flexible printed circuit 104 transmitting an external signal to the terminal portion 103. The display portion 102, the terminal portion 103, and the flexible printed circuit 104 are provided on the substrate 101.

The display portion 102 is a portion that displays an image. The pixels 102a located in the display portion 102 each include an organic EL element 60 (FIG. 3) as a light emitting element. Namely, the assembly of the plurality of pixels 102a acts as the display portion 102. The pixels 102a each include a thin film transistor 50 (FIG. 3) described below as a driving element. In this embodiment, the thin film transistor 50 included in each pixel 102a is controlled to control light emission of the organic EL element 60 included in each pixel 102a.

The terminal portion 103 includes a line group including lines connected to the display portion 102, and acts as a terminal supplying an external signal. The external signal is transmitted from the flexible printed circuit 104 connected with the terminal portion 103. The terminal portion 103 and the flexible printed circuit 104 may be connected with each other by a known method using an anisotropic conductive film.

The flexible printed circuit 104 is a circuit board usable to transmit or receive a signal to or from an external circuit (not shown). The flexible printed circuit 104 includes a flexible resin substrate and a plurality of lines provided thereon, and is bonded to the terminal portion 103 with an anisotropic conductive film or the like.

In this embodiment, various signals are input to the display portion 102 from the external circuit (not shown). Nonetheless, although not shown, a scanning line driving circuit supplying a scanning signal to a scanning line (gate line) and/or a video signal driving circuit supplying a video signal to a video signal line (data line) may be formed on the substrate 101 by use of the thin film transistor 50. Although not shown, an IC chip acting as a driving circuit outputting such a scanning signal and/or such a video signal may be located on the substrate 101 or the flexible printed circuit 104.

Now, a structure of the pixel 102a of the organic EL display device 100 in this embodiment will be described. The pixel 102a shown in FIG. 1 actually includes three sub pixels respectively corresponding to three primary colors of RGB. Specifically, in this embodiment, one pixel 102a includes a sub pixel 102Ra corresponding to red, a sub pixel 102Ga corresponding to green, and a sub pixel 102Ba corresponding to blue. In this embodiment, the sub pixel 102Ra, the sub pixel 102Ga and the sub pixel 102Ba have the same structure. Therefore, the sub pixel 102Ra will be described below, and the descriptions of the sub pixel 102Ga and the sub pixel 102Ba will be omitted.

Figure 2:
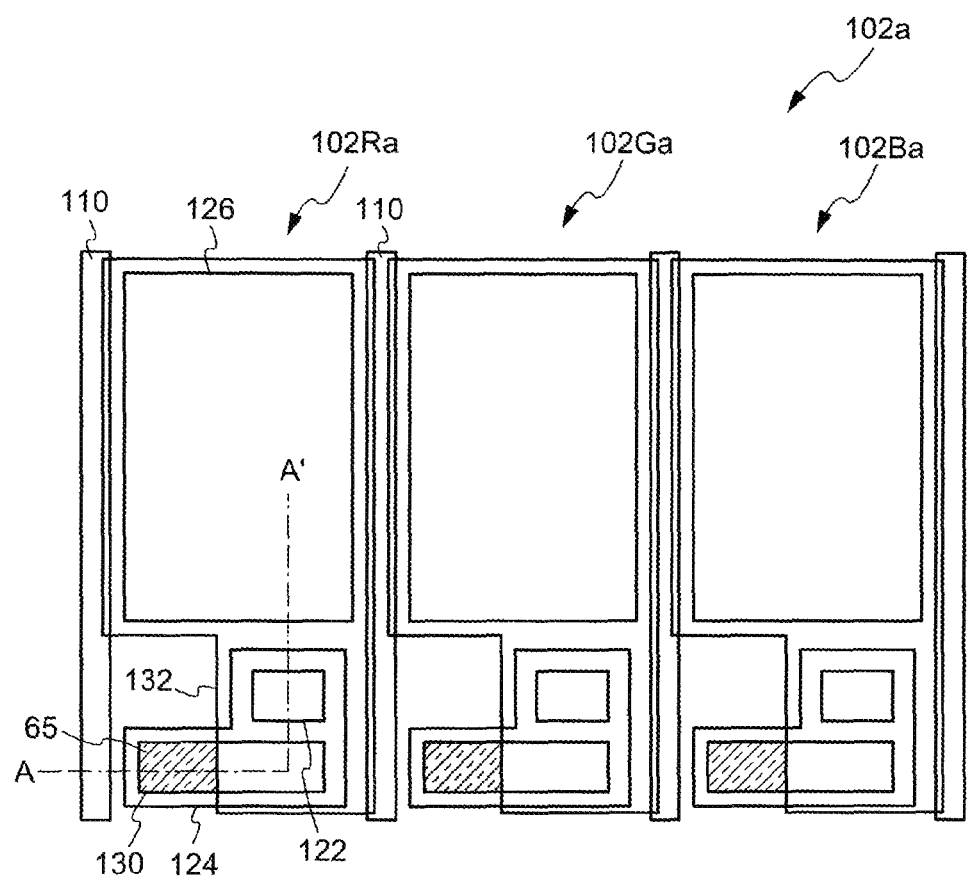
FIG. 2 is a plan view showing a structure of a pixel of the organic EL display device in embodiment 1.
Figure 3:
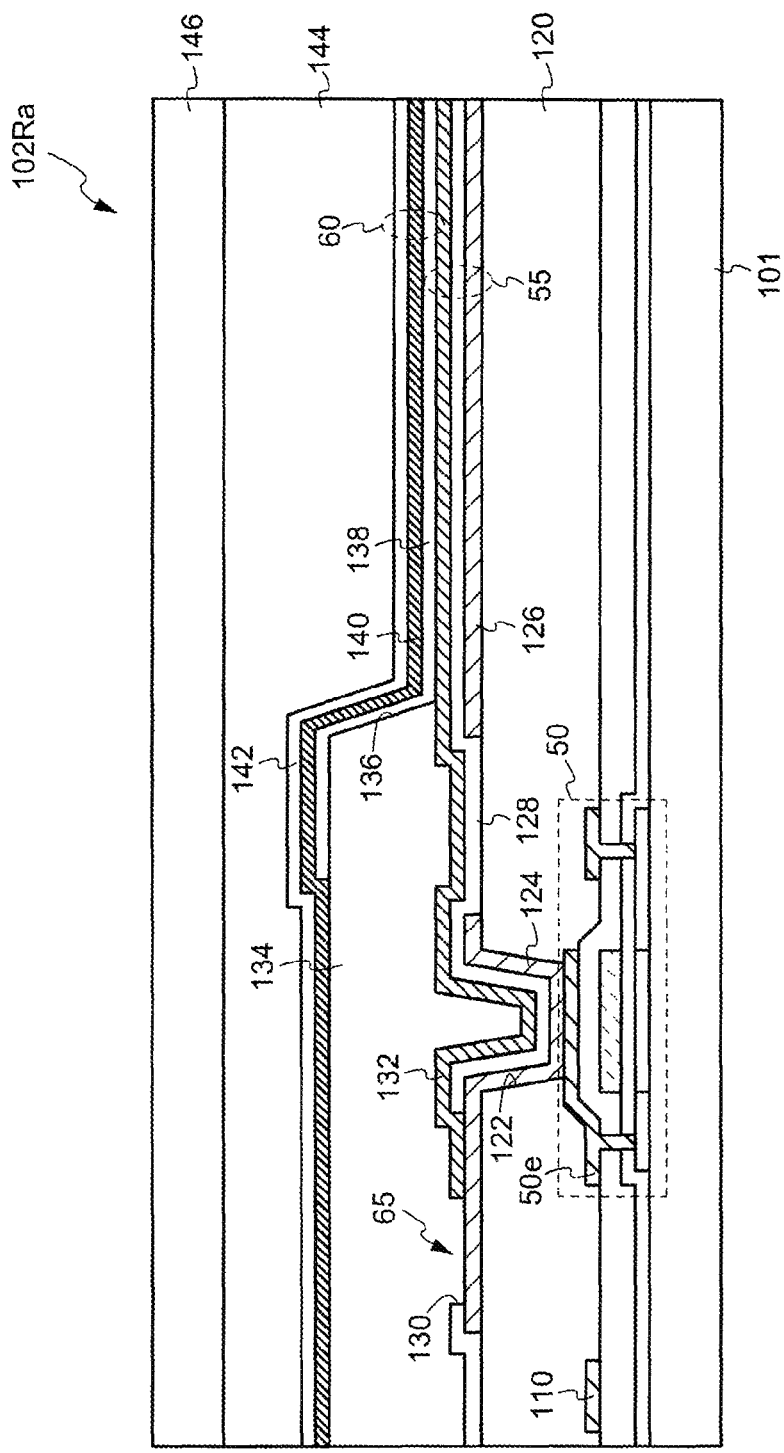
FIG. 3 is a cross-sectional view showing a structure of a sub pixel of the organic EL display device in embodiment 1.

FIG. 2 is a plan view of showing a structure of the pixel 102a of the organic EL display device 100 in embodiment 1. FIG. 3 is a cross-sectional view showing a structure of the sub pixel 102Ra of the organic EL display device 100 in embodiment 1. The cross-sectional view of the sub pixel 102Ra in FIG. 3 is taken along one-dot chain line A-A' in FIG. 2.

As shown in FIG. 3, the thin film transistor 50 is provided on the substrate 101. The thin film transistor 50 is a so-called top gate-type thin film transistor. The thin film transistor 50 is not limited to being of this type, and any type of thin film transistor may be provided. The thin film transistor 50 shown in FIG. 3 acts as a driving transistor supplying an electric current to the organic EL element 60. In this embodiment, the thin film transistor 50 is an N-channel transistor. Therefore, the organic EL element 60 is connected with a source electrode 50e of the thin film transistor 50.

The structure of the thin film transistor 50 is known, and thus will not be described in detail. Although not shown in FIG. 3, a storage capacitance may be formed in the process of forming the thin film transistor 50. In this case, the storage capacitance may include any two of conductive films included in the thin film transistor 50 and an insulating film provided between the two conductive films. Such a storage capacitance may have any known structure.

The thin film transistor 50 is covered with an organic insulating film 120. The organic insulating film 120 acts as a flattening film flattening the unevenness caused by the formation of the thin film transistor 50. In this embodiment, the organic insulating film 120 may be formed of an insulating film containing a resin material such as an acrylic resin, a polyimide resin or the like.

The organic insulating film 120 has an opening 122 provided therein. The opening 122 is formed by removing a part of the organic insulating film 120. At this point, the opening 122 is formed to expose a part of the source electrode 50e of the thin film transistor 50. As described below, the thin film transistor 50 and a pixel electrode 132 are electrically connected with each other via the opening 122.

The opening 122 formed in the organic insulating film 120 is covered with an oxide conductive film 124. In this embodiment, the oxide conductive film 124 may be formed by patterning a thin film formed of a metal oxide material such as ITO (Indium Tin Oxide) or the like. The oxide conductive film 124 is not limited to being formed of such a material and may be formed of any other oxide conductive film. The oxide conductive film 124 is connected with the source electrode 50e exposed by the opening 122.

A lower electrode 126 of a storage capacitance 55 is provided on a top surface of the organic insulating film 120. The lower electrode 126 is formed of an oxide conductive film that is different from the oxide conductive film 124 but is formed at the same time as the oxide conductive film 124. The lower electrode 126 is provided below the organic EL element 60. As described below, the organic EL element 60 in this embodiment is of a structure that emits light upward. Therefore, a space below the light emitting element 60 may be utilized to form the storage capacitance 55.

Although shown in neither FIG. 2 nor FIG. 3, the oxide conductive films used for forming the oxide conductive film 124 and the lower electrode 126 of the storage capacitance 55 may be used for another use (e.g., as a line). In this case, a metal film may be located on the oxide conductive film used as the line, so that the line resistance is decreased. An oxide conductive film formed of a metal oxide has a line resistance higher than that of a metal film. Therefore, in the case where the oxide conductive film is used as the line, it is preferred that the metal film is provided thereon to decrease the entire line resistance. In this case, the oxide conductive film 124 also acts as a protective film protecting the source electrode 50e of the thin film transistor 50 against etching gas in the step of forming the metal film.

An inorganic insulating film 128 is provided on the organic conductive film 124 and the lower electrode 126. In this embodiment, the inorganic insulating film 128 is formed of a silicon nitride film. The inorganic insulating film 128 is not limited to being formed of silicon nitride, and may be formed of another inorganic insulating film such as a silicon oxide film or the like. The inorganic insulating film 128 has an opening 130 provided therein exposing a part of the organic conductive film 124.

The pixel electrode 132 is provided on the inorganic insulating film 128. The pixel electrode 132 is connected with the oxide conductive film 124 via the opening 130 formed in the inorganic insulating film 128. Namely, the pixel electrode 132 is connected with the thin film transistor 50 via the oxide conductive film 124. The pixel electrode 132 also acts as an upper electrode of the storage capacitance 55, and also as an anode electrode of the organic EL element 60.

The pixel electrode 132 covers a part of the opening 130. Therefore, in regions represented by hatching in FIG. 2 (hereinafter, referred to as "water drawing regions") 65, the organic insulating film 120 and an organic insulating film 134 acting as a bank face each other with the oxide conductive film 124 being provided between the organic insulating film 120 and the organic insulating film 134. A reason why such a structure is adopted will be described below.

In this embodiment, the pixel electrode 132 is formed of a conductive film having a stack structure including oxide conductive films of ITO or the like and a silver-containing thin film provided between the oxide conductive films. The pixel electrode 132 is not limited to having such a structure. It is desirable that the pixel electrode 132 includes a reflective conductive film to allow light emitted from the organic EL element 60 to be output upward.

In this embodiment, a dielectric film included in the storage capacitance 55 is a silicon nitride film, which has a dielectric constant higher than that of other insulating films. This provides an advantage that a high capacitance is easily provided. In addition, the space below the organic EL element 60 may be effectively utilized to provide the storage capacitance 55. This provides an advantage that the area size occupied by the storage capacitance 55 is easily made large.

The pixel electrode 132 is partially covered with the organic insulating film 134. Specifically, the organic insulating film 134 covers an end of the pixel electrode 132 and has an opening 136 provided therein exposing a part of a top surface of the pixel electrode 132. The organic insulating film 134 having such a structure is generally referred to as a "bank" or a "rib", and has a role of defining a light emitting region. The organic insulating film 134 may be formed of a resin material such as a photosensitive acrylic resin, a polyimide resin or the like, but is not limited to being formed of such a material.

On a region of the top surface of the pixel electrode 132 that does not overlap the organic insulating film 134 (i.e., region in the opening 136), an organic EL layer 138 is provided. In this embodiment, the organic EL layer 138 is formed of an organic EL material by vapor deposition. The organic EL layer 138 includes at least a light emitting layer, and may also include an electron injection layer, an electron transfer layer, an electron blocking layer, a hole injection layer, a hole transfer layer, and/or a hole blocking layer. The organic EL layer 138 shown in FIG. 3 includes a light emitting layer containing an organic EL material emitting red light.

In this embodiment, light emitting layers that emit light of different colors are provided in different pixels. The light emitting layers are not limited to having such a structure. For example, although not shown, an organic EL layer emitting white light may be provided in the plurality of pixels 102a, and the while light may be colored red, green or blue by use of a color filter provided in each of the pixels 102*a*. The functional layers such as the electron injection layer, the electron transfer layer, the electron blocking layer, the hole injection layer, the hole transfer layer, and the hole blocking layer may be provided commonly for the plurality of pixels 102*a*.

A common electrode 140 formed of a conductive film containing an alkaline metal material or an alkaline earth-metal material is provided on the organic EL layer 138. The alkaline metal material or alkaline earth-metal material may be, for example, magnesium (Mg), lithium (Li) or the like. In this embodiment, an MgAg film formed of an alloy of magnesium and silver is used as the conductive film containing an alkaline earth-metal material. The common electrode 140 acts as a cathode electrode of the organic EL element 60. The common electrode 140 is provided commonly for the plurality of pixels 102*a*.

In the case where the display device 100 is of a top emission-type, in which the light from the organic EL layer 138 is output upward, namely, is output toward the common electrode 140, the common electrode 140 needs to be light-transmissive. Therefore, in the case of being formed of the above-described conductive film containing an alkaline metal material, the common electrode 140 is made sufficiently thin to transmit light and thus is made light-transmissive. Specifically, the common electrode 140 has a thickness of 10 nm or greater and 30 nm or less to be light-transmissive.

A sealing film 142 is provided on the common electrode 140. The sealing film 140 has a role of preventing entrance of moisture from outside and thus preventing deterioration of the organic EL layer 138 and the common electrode 140. Although not shown in detail in FIG. 3, in this embodiment, the sealing film 142 has a three-layer stack structure including silicon nitride films and a resin film provided between the silicon nitride films. The sealing film 142 is not limited to having such a structure. Silicon oxide films may be used instead of, or in addition to, the silicon nitride films.

A cover member 146 is provided on the sealing film 142 with a filler member 144 being located between the cover member 146 and the sealing film 142. The filler member 144 also acts as an adhesive bonding the cover member 146. The filler member 144 is formed of an acrylic resin in this embodiment, but is not limited to being formed of an acrylic resin. In this embodiment, the cover member 146 is provided. The filler member 144 and the cover member 146 may be omitted.

As shown in FIG. 2 and FIG. 3, in this embodiment, the opening 130 is formed in a part of the inorganic insulating film 128, and the oxide conductive film 124 and the pixel electrode 132 are in contact with each other in a part of the opening 130. Specifically, as seen in a plan view, the inorganic insulating film 128 has the opening 130, overlapping the organic insulating film 134, at a position not overlapping the opening 122 provided in the organic insulating film 120.

As described above, in the organic EL display device 100 in this embodiment, the opening 130 acts as a region providing the electric connection between the oxide conductive film 124 and the pixel electrode 132 with certainty (i.e., as a contact hole), and also acts as a region allowing moisture generated in the organic insulating film 120 formed of a resin material to escape outside.

In the case where an insulating film is formed of a resin material, moisture remaining in the insulating film may be discharged from inside in a heating process performed after the formation of the insulating film. Therefore, in this embodiment, the opening 130 is provided in the inorganic insulating film 128 in order to allow the moisture discharged from the inside of the organic insulating film 120 to escape outside. In FIG. 2, the opening 130 is provided in each of the sub pixels 102Ra, 102Ga and 102Ba. The opening 130 may be provided at any position. For example, the opening 130 may not be provided in any of the sub pixels 102Ra, 102Ga and 102Ba. Alternatively, the opening 130 may be provided at a rate of one per a plurality of sub pixels.

As described above, in this embodiment, the opening 130 is provided in the inorganic insulating film 128 to form the water drawing region 65, so that the moisture discharged from the organic insulating film 120 is not prevented by the inorganic insulating film 128 from escaping outside. In addition, in this embodiment, in the opening 130, the organic insulating film 120 is covered with the oxide conductive film 124. A reason why such a structure is adopted will be described with reference to FIG. 4A, FIG. 4B and FIG. 4C.

FIG. 4A, FIG. 4B and FIG. 4C show an example in which the oxide conductive film 124 is not located in the opening 130 in the inorganic insulating film 128. A region 64 is to be the water drawing region 65 in a later step.

As shown in FIG. 4A, the oxide conductive film 124 is formed on the organic insulating film 120. In the step of forming the oxide conductive film 124, a surface and the vicinity thereof (region 121*a*) of the exposed part of the organic insulating film 120 may be damaged. For example, in the case where the oxide conductive film 124 is etched by dry etching, the oxide insulating film 120 may be damaged by plasma. In the case where the oxide conductive film 124 is etched by wet etching, the composition of the oxide insulating film 120 may be denatured by the influence of an etchant and thus damaged.

As shown in FIG. 4B, the inorganic insulating film 128 is formed on the organic insulating film 120 and the oxide conductive film 124. In this embodiment, the inorganic insulating film 128 is formed of a silicon nitride film, and thus the etching is usually performed by dry etching. Therefore, in the step of forming the opening 130 in the inorganic insulating film 128, the organic insulating film 120 may be damaged by plasma in a region 121*b*.

As shown in FIG. 4C, the pixel electrode 132 is formed on the organic insulating film 120, the oxide conductive film 124 and the inorganic insulating film 128. In the step of forming the pixel electrode 132 also, the surface and the vicinity thereof (region 121*c*) of the organic insulating film 120 may be damaged by the etching.

As described above, in the case where the oxide conductive film 124 is not located in the opening 130 in the inorganic insulating film 128, the surface and the vicinity thereof of the organic insulating film 120 may be damaged at least three times before the pixel electrode 132 is formed. According to the knowledge of the present inventors, a resin film damaged as described above may have a moisture absorbing property thereof increased. Therefore, in the case where the pixel electrode 132 is formed in the process shown in FIG. 4A, FIG. 4B and FIG. 4C, the moisture may be gradually discharged from the damaged resin film after the organic EL layer 138 and the common electrode 140 are formed.

In consideration of the above, the organic EL display device 100 in this embodiment has a structure in which the organic insulating film 120 is covered with the oxide conductive film 124 in the opening 130 formed in the inorganic insulating film 128. Specifically, in the organic EL display device 100 in this embodiment, as shown in FIG. 3, the organic insulating film 120 and the organic insulating film 134 face each other in the opening 130 provided in the inorganic insulating film 128, with the oxide conductive film 124 being located between the organic insulating film 120 and the organic insulating film 134.

Such a structure prevents the organic insulating film 120 from being damaged as described above with reference to FIG. 4A, FIG. 4B and FIG. 4C. Namely, in this embodiment, the oxide conductive film 124 acts as an electrode connecting the pixel electrode 132 and the thin film transistor 50 to each other and also acts as a protective film protecting the organic insulating film 120 against the etching process.

Since the inorganic insulating film 128 has the opening 130 provided therein, the moisture generated in the organic insulating film 120 is discharged outside via the water drawing region 65. In the organic EL display device 100 in this embodiment, the water drawing region 65 is covered with the oxide conductive film 124. However, the oxide conductive film 124 has a moisture permeation property higher than that of the inorganic insulating film 128 formed of a silicon nitride film, and therefore, permeates the moisture.

As described above, the organic EL display device 100 in this embodiment decreases the influence of the moisture contained in the insulating film containing a resin material.

<Method for Producing the Organic EL Display Device>

Now, a method for producing the organic EL display device 100 in this embodiment will be described with reference to FIG. 5A to FIG. 5F. FIG. 5A to FIG. 5F are each a cross-sectional view showing a step of the method for producing the organic EL display device 100 in this embodiment.

Figure 5A:
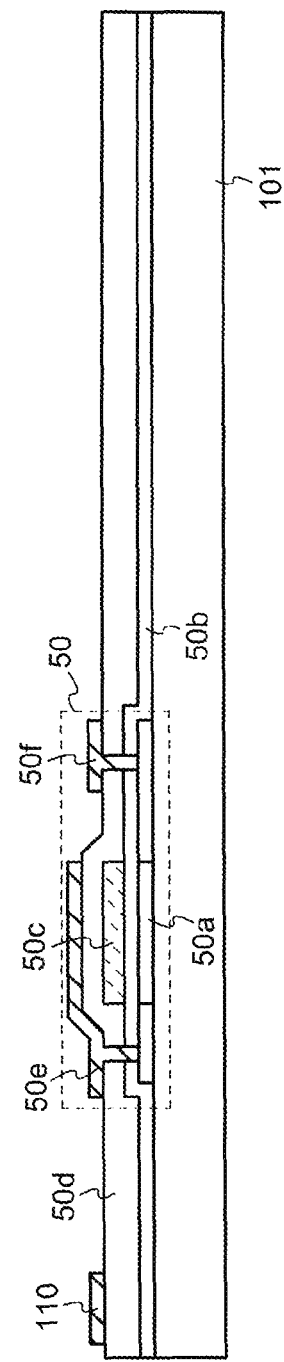
FIG. 5A is a cross-sectional view showing an example of step in a method for producing the organic EL display device in embodiment 1.

First, as shown in FIG. 5A, the thin film transistor 50 and a vide signal line 110 are formed on the substrate 101. The thin film transistor 50 may be formed by any known method with no specific limitation. The substrate 101 is a glass substrate in this embodiment, but may be any other insulating substrate.

In the case where the substrate 101 is a flexible substrate formed of a resin material, a resin film of polyimide or the like is formed on a support substrate, and the thin film transistor 50 and the video signal line 110 are formed on the resin film. After the sealing film 142 shown in FIG. 3 is formed, the support substrate may be peeled off.

In this embodiment, the thin film transistor 50 and the video signal line 110 are formed as follows. An underlying insulating film (not shown) is formed on the substrate 101, and a semiconductor film 50a is formed on the underlying insulating film. Next, a gate insulating film 50b covering the semiconductor film 50a is formed. After the gate insulating film 50b is formed, a gate electrode 50c is formed on a region of the gate insulating film 50b that overlaps the semiconductor film 50a. Next, an insulating film 50d covering the gate electrode 50c is formed. After this, the source electrode 50e and a drain electrode 50f to be connected with the semiconductor film 50a via a contact hole formed in the insulating film 50d are formed. At the same time, the video signal line 110 is formed. In this manner, the thin film transistor 50 and the video signal line 110 are formed on the substrate 101.

Figure 5B:
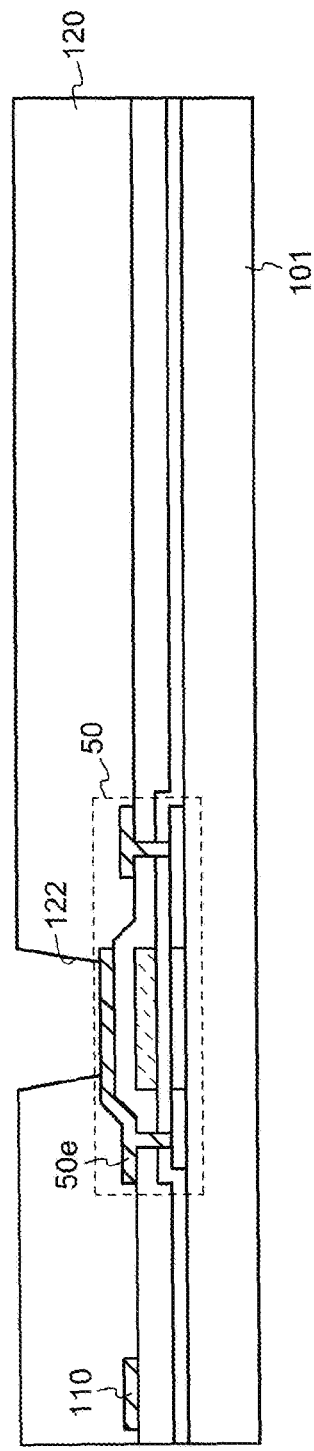
FIG. 5B is a cross-sectional view showing the example of step in the method for producing the organic EL display device in embodiment 1.

After the thin film transistor 50 and the video signal line 110 are formed, as shown in FIG. 5B, the organic insulating film 120 is formed. In this embodiment, a positive photosensitive acrylic resin material is used to form the organic insulating film 120. In more detail, an acrylic resin material for forming the organic insulating film 120 is applied to form a film, and the film of the acrylic resin material is patterned by photolithography, by selectively exposing, to light, a region thereof where the opening 122 is to be formed, so that the unnecessary part of the acrylic resin material is removed. In this manner, the organic insulating film 120 having the opening 122 provided therein is formed without etching. As shown in FIG. 5B, the opening 122 is formed to expose a part of the source electrode 50e of the thin film transistor 50.

Figure 5C:
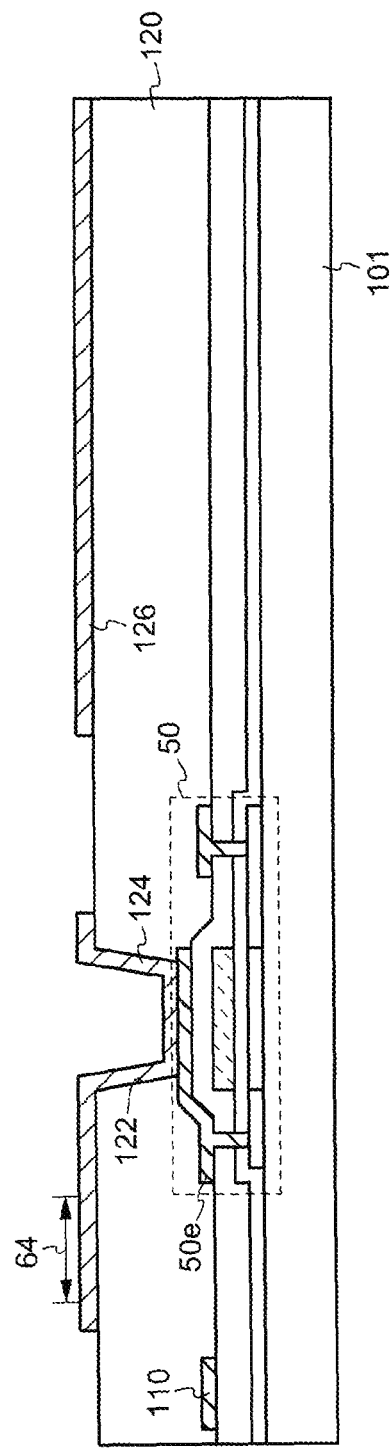
FIG. 5C is a cross-sectional view showing the example of step in the method for producing the organic EL display device in embodiment 1.

After the opening 122 is formed, as shown in FIG. 5C, the oxide conductive film 124 and the lower electrode 126 of the storage capacitance 55 are formed of a metal oxide material such as ITO or the like to cover the opening 122.

The oxide conductive film 124 and the lower electrode 126 are formed by patterning an oxide conductive film of ITO or the like, formed to cover the organic insulating film 120, by photolithography. The oxide conductive film 124 covers the exposed part of the source electrode 50e of the thin film transistor 50. The lower electrode 126 is formed in a region where the organic EL element 60 is to be formed in a later step.

The oxide conductive film 124 is extended to overlap the region 64, of the surface of the organic insulating film 120, which corresponds to the water drawing region 65 shown in FIG. 2 and FIG. 3. Therefore, in the region 64 corresponding to the water drawing region 65, the organic insulating film 120 is not damaged by the etching process for the formation of the oxide conductive film 124.

In a region that does not need to be light-transmissive, a metal film may be directly formed on a conductive film containing a metal oxide material to form a stack-structured conductive film. Such a stack-structured conductive film decreases the resistance by the metal film and thus is effectively usable as a line or an electrode.

Figure 5D:
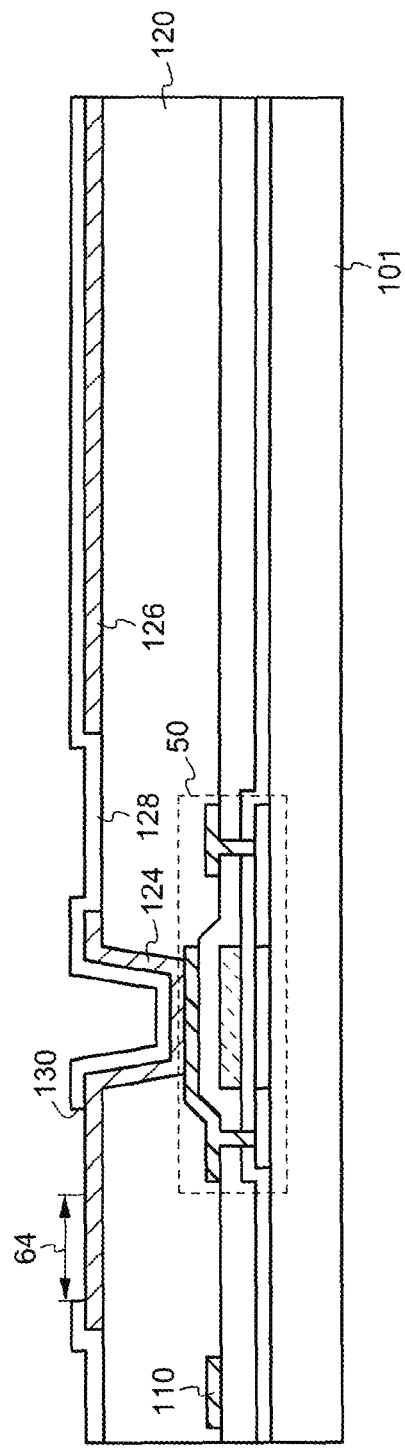
FIG. 5D is a cross-sectional view showing the example of step in the method for producing the organic EL display device in embodiment 1.

After the oxide conductive film 124 and the lower electrode 126 are formed, as shown in FIG. 5D, the inorganic insulating film 128 is formed. In this embodiment, a silicon nitride film is formed as the inorganic insulating film 128. In a region of the inorganic insulating film 128 that overlaps the oxide conductive film 124 (this region includes the above-described region 64), the opening 130 is formed. In the step of forming the opening 130, the oxide conductive film 124 acts as a protective film. Therefore, the organic insulating film 120 is not damaged by the formation of the opening 130. The inorganic insulating film 128 acts as a dielectric film included in the storage capacitance 55.

After the opening 130 is formed in the inorganic insulating film 128, as shown in FIG. 5E, the pixel electrode 132 is formed. The pixel electrode 132 is formed to overlap a part of the opening 130. Therefore, the pixel electrode 132 is connected with the oxide conductive film 124 in the opening 130. In other words, the pixel electrode 132 is connected with the thin film transistor 50 via the oxide conductive film 124.

In this step, a region of the oxide conductive film 124 exposed to the opening 130 acts as the region 65.

As a result of the formation of the pixel electrode 132, the storage capacitance 55 including the lower electrode 126, the inorganic insulating film 128 and the pixel electrode 132 is formed below the organic EL element 60. In this embodiment, although not shown, the storage capacitance 55 is located between the gate electrode 50c and the source electrode 50e of the thin film transistor 50, which is an N-channel transistor. Namely, the lower electrode 126, which is one of two electrodes of the storage capacitance 55, is connected with the gate electrode 50c. The pixel electrode 132, which is the other electrode of the storage capacitance 55, is connected with the source electrode 50e.

Figure 5F:
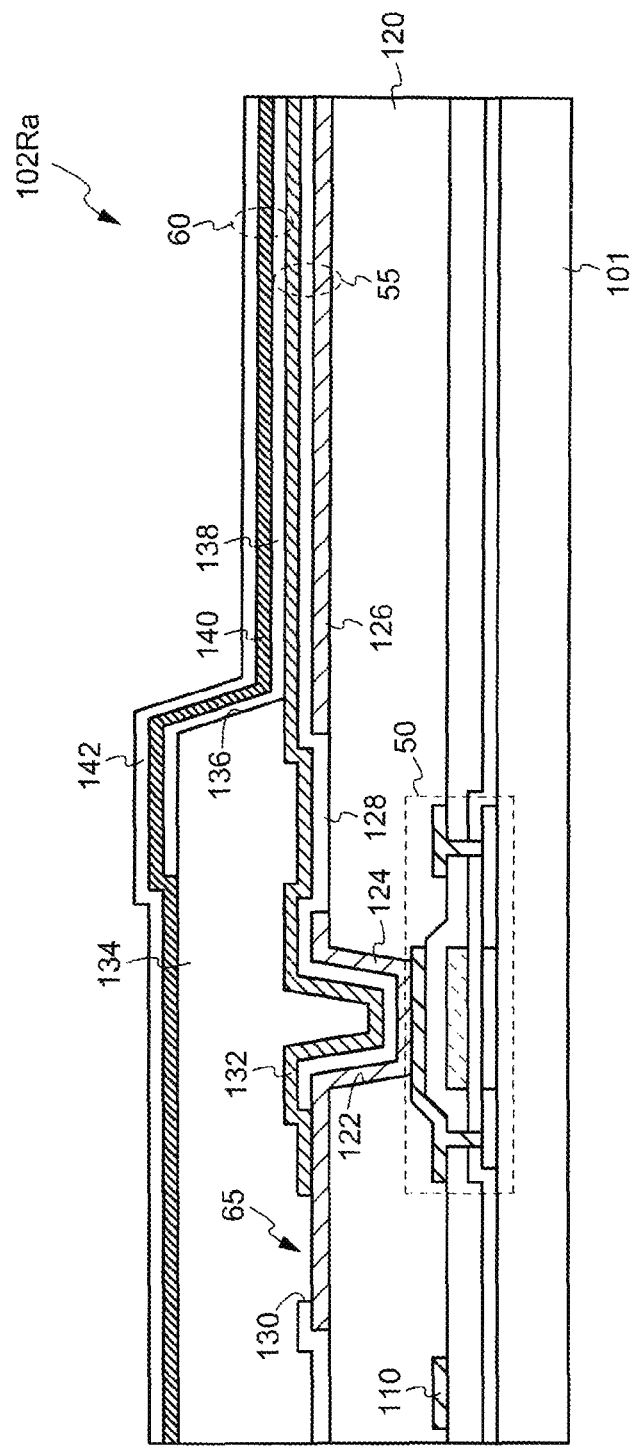
FIG. 5F is a cross-sectional view showing the example of step in the method for producing the organic EL display device in embodiment 1.

After the pixel electrode 132 is formed, as shown in FIG. 5F, the organic insulating film 134 acting as the bank is formed. In this embodiment, a photosensitive acrylic resin material is used to form the organic insulating film 134. The organic insulating film 134 is formed by patterning to cover an outer periphery of the pixel electrode 132 and to expose the top surface of the pixel electrode 132. The opening 136, which is formed by the patterning, defines a region acting as a light emitting element (light emitting region) on the top surface of the pixel electrode 132.

In this embodiment, the organic insulating film 134 and the oxide conductive film 124 contact each other in the water drawing region 65. In other words, the organic insulating film 120 as the flattening film, and the organic insulating film 134 as the bank, face each other in the opening 130 with the oxide conductive film 124 being located between the organic insulating film 120 and the organic insulating film 134. In such a structure, even if being discharged from the organic insulating film 120, the moisture is discharged outside via the oxide conductive film 124 and the organic insulating film 134.

In this embodiment, the organic insulating film 120, after being formed, is subjected to a heating process accompanying the formation of the oxide conductive film 124, the inorganic insulating film 128 and the pixel electrode 132. Therefore, moisture is discharged from the organic insulating film 120 during the heating process. During a baking process performed to form the organic insulating film 134, moisture is discharged from the organic insulating film 120.

As described above, in this embodiment, the moisture remaining in the organic insulating film 120 is mostly discharged before the organic insulating film 134 is formed. In addition, there is no such damage as described above with reference to FIG. 4A to FIG. 4C on the organic insulating film 120. Therefore, it does not occur that the organic insulating film 120 has the moisture absorbing property increased to keep on discharging moisture for a long time. For this reason, extra moisture is removed from the organic insulating film 120 before the organic EL layer 138 and the common electrode 140 are formed.

After the organic insulating film 134 acting as the bank is formed, the organic EL layer 138 and the common electrode 140 are formed. In this embodiment, the organic EL layer 138 and the common electrode 140 are formed by vapor deposition pixel by pixel. The organic EL layer 138 and the common electrode 140 are not limited to being formed in this manner. For example, the functional layers other than the light emitting layer, for example, the electron transfer layer or the hole transfer layer, may be commonly provided for a plurality of pixels 102*a*. The organic EL layer 138 usable in this embodiment may be formed of any known material with no specific limitation. In FIG. 5F, the sub pixel 102Ra emitting red light is shown as an example. Therefore, the light emitting layer included in the organic EL layer 138 is formed of a light emitting material emitting red light.

In this embodiment, an MgAg film is used as the common electrode 140. Like the organic EL layer 138, a conductive film containing an alkaline earth-metal material is vulnerable against moisture or the like. Therefore, it is desirable that the vapor deposition to form the organic EL layer 138 and the vapor deposition to form the common electrode 140 are performed without exposing the materials to the atmosphere. In this case, it is preferable that the vapor deposition to form the organic EL layer 138 and the vapor deposition to form the common electrode 140 are performed continuously while a vacuum state is maintained. The present invention is not limited to this, and such continuous vapor deposition may be performed while an inert atmosphere such as a nitrogen atmosphere or the like is maintained.

At this point, the organic EL element 60 including the pixel electrode 132, the organic EL layer 138 and the common electrode 140 is formed in the opening 130 provided in the organic insulating film 134.

Next, a silicon nitride film, a resin film formed of an acrylic resin material, and a silicon nitride film are stacked in this order to form the sealing film 142. In this step, the resin film forming a part of the sealing film 142 flattens the unevenness caused by the organic EL layer 138 and the common electrode 140. Since the resin film flattens the unevenness, even if foreign objects such as particles or the like are on the common electrode 140, the possibility that the silicon nitride film formed on the resin film is peeled off by the influence of the foreign objects or that a coverage fault is caused is decreased.

After the state shown in FIG. 5F is obtained, the cover member 146 such as a glass substrate or the like is formed on the substrate 101 with the filler member 144 formed of a resin material being located between the cover member 146 and the substrate 101. In such a process, the organic EL display device 100 shown in FIG. 3 is produced.

Embodiment 2

In embodiment 2, an example in which an organic EL display device has a layout different from that in embodiment 1 will be described. In this embodiment, structural differences from the organic EL display device 100 in embodiment 1 will be mainly described. Components that are same as those in embodiment 1 will bear the identical reference signs thereto and descriptions thereof may be omitted.

Figure 6:
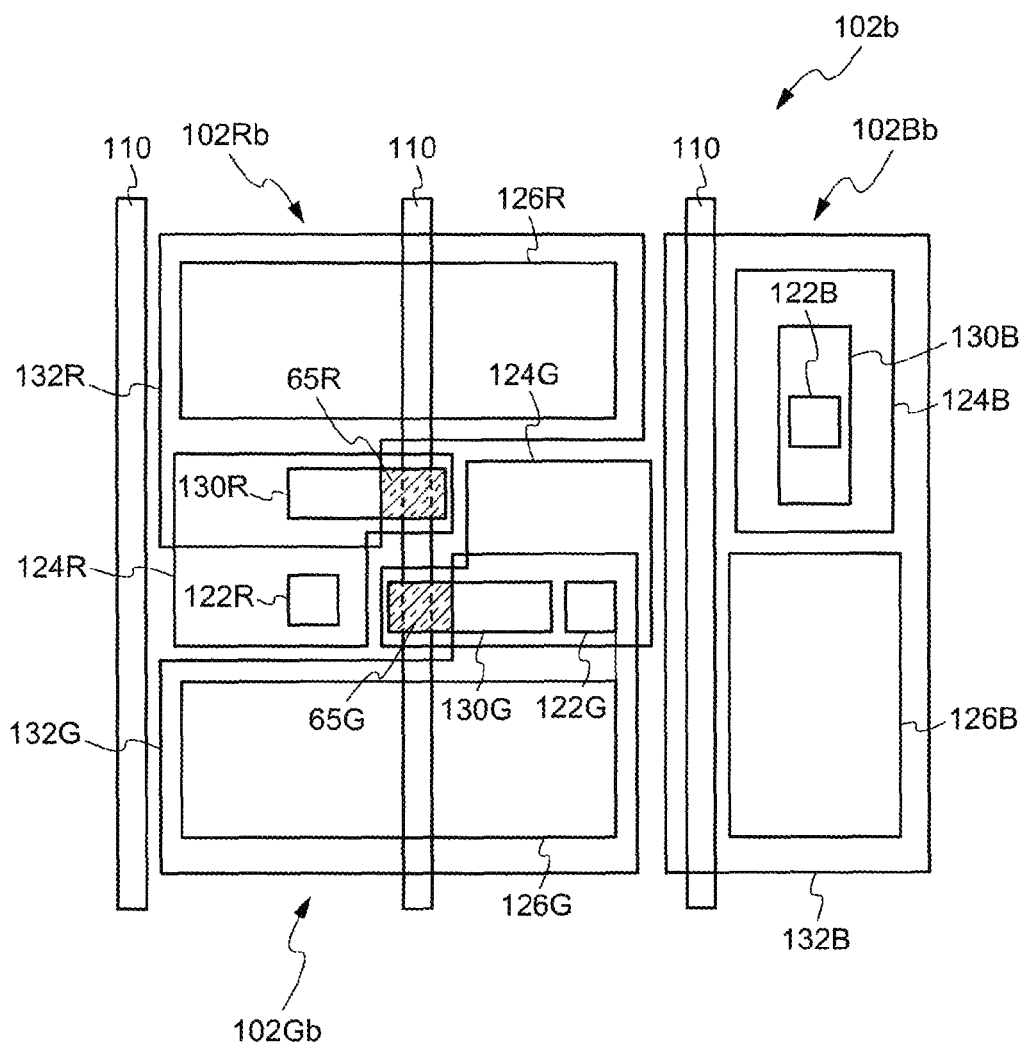
FIG. 6 is a plan view showing a layout of a pixel of an organic EL display device in embodiment 2.

FIG. 6 is a plan view showing a structure of a pixel 102*b* of an organic EL display device in this embodiment. In this embodiment also, the pixel 102*b* includes three sub pixels 102Rb, 102Gb and 102Bb. In this embodiment, the sub pixels 102Rb and 102Gb are arrayed in a vertical direction (vertical direction in FIG. 6), and the sub pixel 102Bb is located adjacent to the sub pixels 102Rb and 102Gb in a horizontal direction (horizontal direction in FIG. 6).

The sub pixel 102Rb includes an opening 122R provided in a flattening film (not shown), an oxide conductive film 124R, a lower electrode 126R of a storage capacitance, an opening 130R provided in an insulating film (not shown), and a pixel electrode 132R. The opening 130R is provided to overlap the oxide conductive film 124R. The oxide conductive film 124R is connected to a thin film transistor (not shown) via the opening 122R. The oxide conductive film 124R is connected with the pixel electrode 132R in the opening 130R. A region of the opening 130R that does not overlap the pixel electrode 132R acts as a water drawing region 65R.

The components of each of the sub pixels 102Gb and 102Bb are basically the same as those of the sub pixel 102Rb described above. Thus, the components are represented by the same reference signs as those described above regarding the sub pixel 102R, with "R" being replaced with "G" or "B". These components will not be described.

In this embodiment, the sub pixel 102Bb does not include a water drawing region. As can be seen, the water drawing region does not need to be provided in all the sub pixels. In accordance with the layout of the pixel, the water drawing region may be provided at any position. For example, one water drawing region may be provided in any one of the sub pixels for the RGB colors, or one water drawing region may be provided per a plurality of pixels. Needless to say, the sub pixel 102Bb may include the water drawing region.

Embodiment 3

In embodiment 3, an example in which the pixel has a structure different from that in embodiment 1 will be described. In this embodiment, structural differences from the organic EL display device 100 in embodiment 1 will be mainly described. Components that are same as those in embodiment 1 will bear the identical reference signs thereto and descriptions thereof may be omitted.

Figure 7:
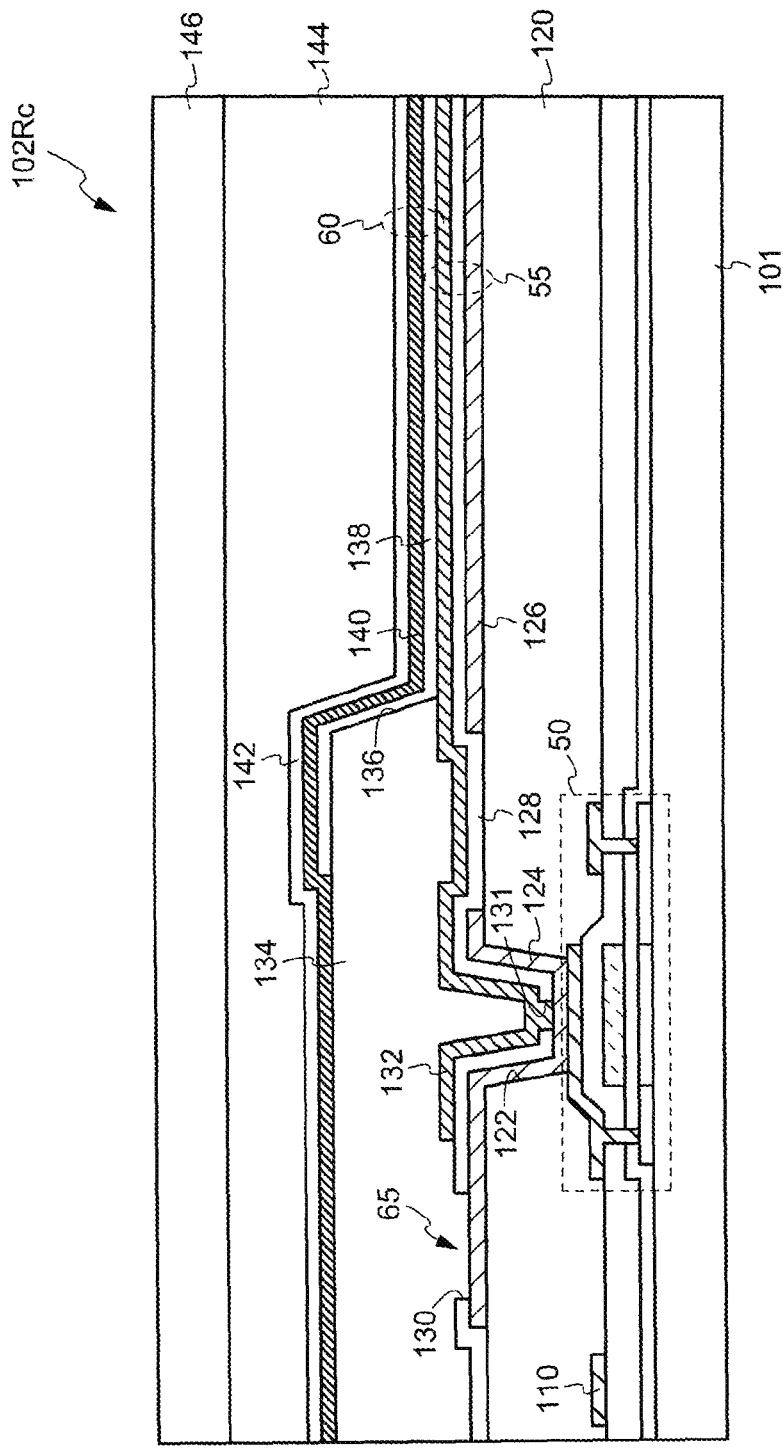
FIG. 7 is a cross-sectional view showing a structure of a pixel of an organic EL display device in embodiment 3.

FIG. 7 is a cross-sectional view showing a structure of a pixel 102Rc of an organic EL display device in embodiment 3. In this embodiment, the inorganic insulating film 128 has an opening 131 provided therein in addition to the opening 130. The opening 131 is located in the opening 122 provided in the organic insulating film 120. Namely, the opening 131 is located at a position overlapping the opening 122. Therefore, as shown in FIG. 7, the pixel electrode 132 is connected with the oxide conductive film 124 via the opening 131. Thus, the water drawing region 65 is defined by the opening 130 provided in the inorganic insulating film 128.

In this embodiment also, in the water drawing region 65, the organic insulating film 120 and the organic insulating film 134 face each other with the oxide conductive film 124 being located between the organic insulating film 120 and the organic insulating film 134.

Embodiment 4

In embodiment 4, an example in which the pixel has a structure different from that in embodiment 1 will be described. In this embodiment, structural differences from the organic EL display device 100 in embodiment 1 will be mainly described. Components that are same as those in embodiment 1 will bear the identical reference signs thereto and descriptions thereof may be omitted.

Figure 8:
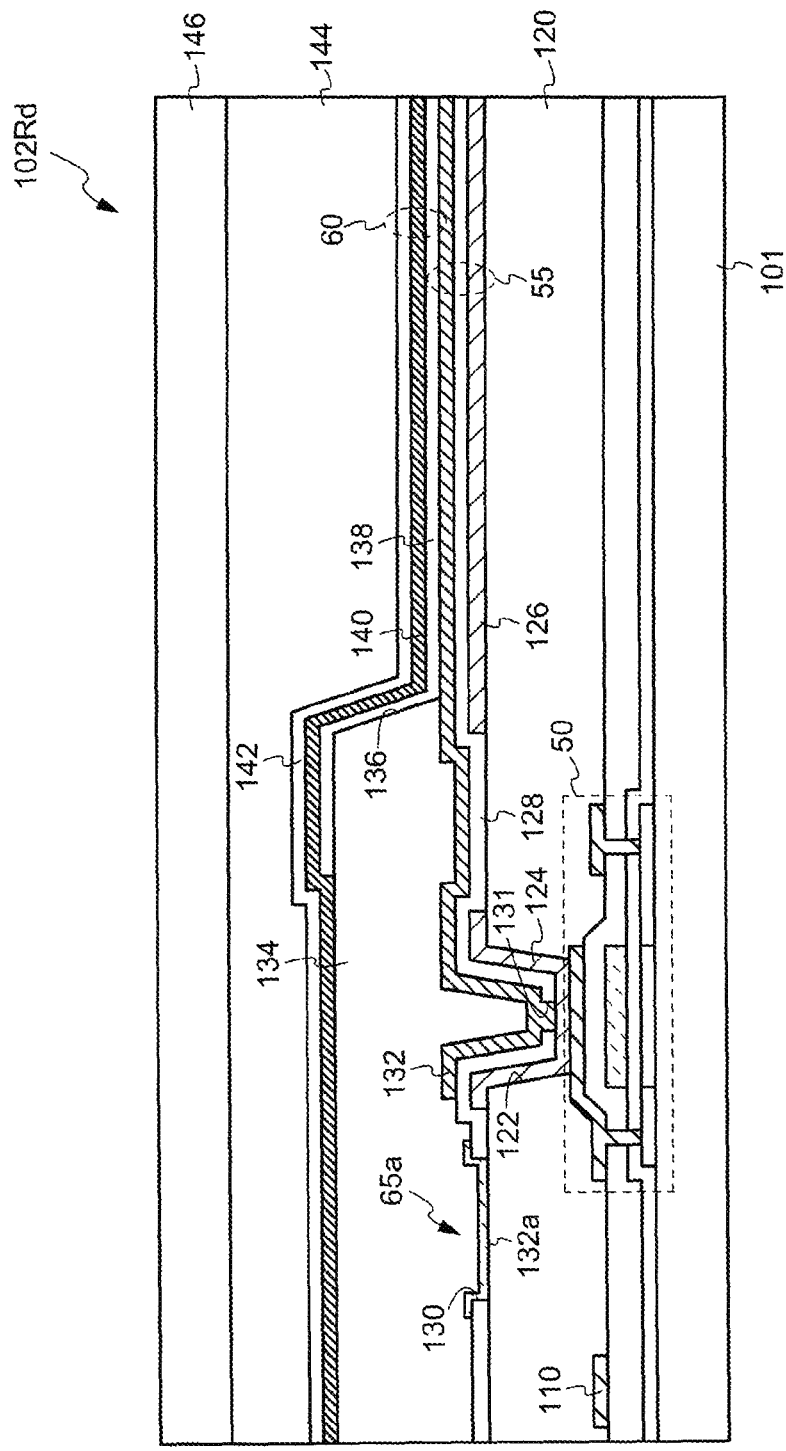
FIG. 8 is a cross-sectional view showing a structure of a pixel of an organic EL display device in embodiment 4.

FIG. 8 is a cross-sectional view showing a structure of a pixel 102Rd of an organic EL display device in embodiment 4. In this embodiment, like in embodiment 3, the inorganic insulating film 128 has the opening 131 provided therein in addition to the opening 130. The opening 131 is located in the opening 122 formed in the organic insulating film 120. Therefore, as shown in FIG. 8, the pixel electrode 132 is connected with the oxide conductive film 124 via the opening 131.

In this embodiment, an oxide conductive film 132a is provided to cover the opening 130. The oxide conductive film 132a acts as a protective film protecting the water drawing region 65.

In this embodiment, the pixel 132 has a stack structure including oxide conductive films of ITO or the like and a silver-containing thin film provided between the oxide conductive films. Therefore, the upper or lower oxide conductive film is usable as the oxide conductive film 132a. Namely, in this embodiment, the oxide conductive film 132a is one layer included in the stack structure of the pixel electrode 132. For example, the lower oxide conductive film may be used to form the oxide conductive film 132a and the lowermost layer of the pixel electrode 132, and then the silver-containing thin film and the upper oxide conductive film may be formed in a region corresponding to the pixel electrode 132. Needless to say, the upper oxide conductive film may be used as the oxide conductive film 132a, or a stack of the upper and lower oxide conductive films may be used as the oxide conductive film 132a.

In this embodiment, the oxide conductive film 132a and the pixel electrode 132 are physically insulated from each other. Alternatively, the oxide conductive film 132a and the pixel electrode 132 may be continuous and connected with each other.

In this embodiment, in the water drawing region 65, the organic insulating film 120 and the organic insulating film 134 face each other with the oxide conductive film 132a (i.e., the conducive film forming a part of the pixel electrode 132) being located between the organic insulating film 120 and the organic insulating film 134.

Embodiment 5

In embodiment 5, an example in which the pixel has a structure different from that in embodiment 1 will be described. In this embodiment, structural differences from the organic EL display device 100 in embodiment 1 will be mainly described. Components that are same as those in embodiment 1 will bear the identical reference signs thereto and descriptions thereof may be omitted.

Figure 9:
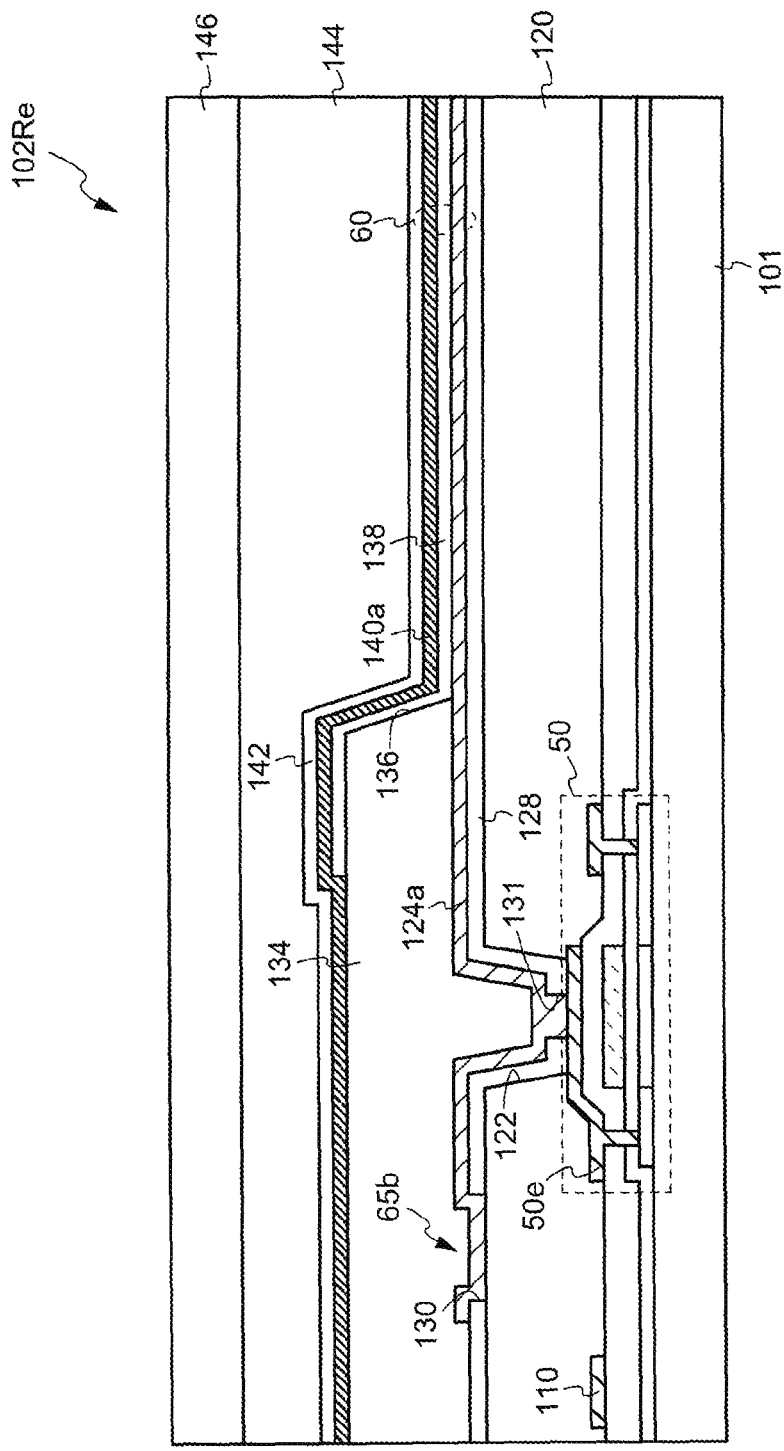
FIG. 9 is a cross-sectional view showing a structure of a pixel of an organic EL display device in embodiment 5.

FIG. 9 is a cross-sectional view showing a structure of a pixel 102Re of an organic EL display device in embodiment 5. In this embodiment, like in embodiment 3, the inorganic insulating film 128 has the opening 131 provided therein in addition to the opening 130. The opening 131 is located in the opening 122 formed in the organic insulating film 120.

In this embodiment, the inorganic insulating film 128 formed of a silicon nitride film is provided on the organic insulating film 120, and an oxide conductive film 124a formed of a metal oxide material such as ITO or the like is provided on the inorganic insulating film 128. Therefore, as shown in FIG. 9, the oxide conductive film 124a is connected with the source electrode 50e of the thin film transistor 50 via the opening 131. The oxide conductive film 124a also acts as a pixel electrode.

The oxide conductive film 124a also acts as an anode electrode of the organic EL element 60. In this case, the oxide conductive film 124a is transparent and conductive. Therefore, light emitted from the organic EL element 60 passes the oxide conductive film 124a and is directed toward the substrate 101. Thus, in this embodiment, it is preferred that a common electrode 140a formed of an MgAg film is thicker than the common electrode 140 in embodiment 1. With such a structure, the light directed toward the common electrode 140a from the organic EL element 60 is reflected by the common electrode 140a and directed toward the substrate 101.

In this embodiment, in a water drawing region 65b, the organic insulating film 120 and the organic insulating film 134 face each other with the oxide conductive film 124a being located between the organic insulating film 120 and the organic insulating film 134.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being located by the present invention.

What is claimed is:

1. A display device, comprising:
   a thin film transistor;
   a first organic insulating film covering the thin film transistor, the first organic insulating film containing a resin material;
   an inorganic insulating film provided on the first organic insulating film;
   a pixel electrode electrically connected with the thin film transistor;
   a second organic insulating film covering an end of the pixel electrode and exposing a top surface of the pixel electrode, the second organic insulating film containing a resin material; and
   an organic layer provided on the top surface of the pixel electrode, the organic layer including a light emitting layer;
   wherein:
   as seen in a plan view, the inorganic insulating film has an opening, overlapping the second organic insulating film, provided therein, the opening being located at a position not overlapping an opening provided in the first organic insulating film;
   the first organic insulating film and the second organic insulating film face each other in the opening provided in the inorganic insulating film, with the pixel electrode being located between the first organic insulating film and the second organic insulating film; and
   the pixel electrode is in contact with the first organic insulating film in the opening provided in the inorganic insulating film.

2. The display device according to claim 1, wherein the pixel electrode is electrically connected with the thin film transistor via the opening provided in the first organic insulating film.

3. The display device according to claim 1, wherein:
   as seen in a plan view, the inorganic insulating film has other opening provided therein, the other opening being located at a position overlapping the opening provided in the first organic insulating film; and
   the pixel electrode is electrically connected with the thin film transistor via the other opening provided in the inorganic insulating film.

4. A display device, comprising:
   a thin film transistor;
   a first organic insulating film covering the thin film transistor, the first organic insulating film containing a resin material;
   an inorganic insulating film provided on the first organic insulating film; and
   an oxide conductive film electrically connected with the thin film transistor via an opening provided in the first organic insulating film;
   wherein as seen in a plan view, the inorganic insulating film has an opening, overlapping the oxide conductive film, provided therein, the opening being located at a position not overlapping the opening provided in the first organic insulating film; and
   the oxide conductive film is provided between the first organic insulating film and the inorganic insulating film.

5. The display device according to claim 4, wherein the oxide conductive film is electrically connected with a pixel electrode via the opening provided in the inorganic insulating film.

6. The display device according to claim 4, wherein:
   as seen in a plan view, the inorganic insulating film has other opening provided therein, the other opening being located at a position overlapping the opening provided in the first organic insulating film; and
   the oxide conductive film is electrically connected with a pixel electrode via the other opening provided in the inorganic insulating film.

7. The display device according to claim 4, wherein the oxide conductive film is provided on the inorganic insulating film.

8. The display device according to claim 7, wherein the oxide conductive film is electrically connected with the thin film transistor via the opening provided in the first organic insulating film.

9. The display device according to claim 7, further comprising a pixel electrode electrically connected with the thin film transistor; wherein:
   the pixel electrode has a stack structure; and
   the oxide conductive film is a layer included in the stack structure.

10. The display device according to claim 9, wherein the oxide conductive film is electrically connected with the pixel electrode.

* * * * *